United States Patent
Mohri et al.

(10) Patent No.: US 6,521,203 B1
(45) Date of Patent: Feb. 18, 2003

(54) PROCESS FOR PRODUCING α-ALUMINA

(75) Inventors: Masahide Mohri, Ibaraki (JP); Yoshio Uchida, Ibaraki (JP); Yoshinari Sawabe, Ibaraki (JP); Hisashi Watanabe, Ibaraki (JP)

(73) Assignee: Sumitomo Chemical Co., Ltd., Osaka (JP)

( * ) Notice: Subject to any disclaimer, the term of this patent is extended or adjusted under 35 U.S.C. 154(b) by 1339 days.

(21) Appl. No.: 08/922,478

(22) Filed: Sep. 3, 1997

Related U.S. Application Data

(63) Continuation of application No. 08/347,451, filed on Feb. 3, 1995, now abandoned.

(30) Foreign Application Priority Data

Jun. 2, 1992 (JP) .............................. 4-168385
Oct. 28, 1992 (JP) .............................. 4-314052

(51) Int. Cl.⁷ .................................. C01F 7/00
(52) U.S. Cl. ..................................... 423/625
(58) Field of Search ................. 423/133, 625

(56) References Cited

U.S. PATENT DOCUMENTS

| | | | | |
|---|---|---|---|---|
| 3,262,754 A | * | 7/1966 | Lindsay et al. | 423/133 |
| 3,961,036 A | * | 6/1976 | Hamner et al. | 423/628 |
| 4,487,756 A | * | 12/1984 | Mizrah et al. | 423/625 |
| 4,822,592 A | | 4/1989 | Misra | 423/625 |
| 5,149,520 A | * | 9/1992 | Sucech et al. | 423/625 |
| 5,302,368 A | * | 4/1994 | Harato et al. | 423/625 |

FOREIGN PATENT DOCUMENTS

| | | |
|---|---|---|
| EP | A0105025 | 4/1984 |
| EP | A0281265 | 9/1988 |
| WO | WO 90 15777 | 12/1990 |

OTHER PUBLICATIONS

62th CATSJ Meeting Abstracts: No. 2D105 (with English translation), 1988, No Month, by Ayame, et al.
Chemical Abstracts, vol. 105, No. 14, Oct. 1986, abstract No. 117463.
Chemical Abstracts, vol. 104, No. 10, Mar. 1986, abstract No. 71187.

* cited by examiner

Primary Examiner—Steven Bos
(74) Attorney, Agent, or Firm—Sughrue Mion, PLLC

(57) ABSTRACT

A process for producing α-alumina containing α-alumina single crystal particles characterized in that at least one of a transition alumina and transition alumina precursor is calcined in an atmosphere containing at least 1% by volume of hydrogen chloride at a temperature of not less than 600° C., preferably from 600 to 1,400° C., and more preferably from 800 to 1,200° C. Aluminum hydroxide, alum, aluminum sulfate, etc. are used as the alumina raw material capable of being converted to transition alumina on heating. α-Alumina comprising octahedral or higher polyhedral α-alumina single crystal particles have a high alumina purity above a given level, are fine and homogeneous, have a narrow particle size distribution, are not agglomerated particles, and can be obtained from raw materials of various kinds, purities, shapes, sizes, and compositions.

7 Claims, 5 Drawing Sheets

10 μm

10 μm

10 μm

10 μm

10 μm

10 μm

PROCESS FOR PRODUCING α-ALUMINA

This is a Continuation of application Ser. No. 08/347,451 filed Feb. 3, 1995 now abandoned.

TECHNICAL FIELD

This invention relates to a process for producing α-alumina. α-Alumina powder has been widely used as an abrasive, a raw material for sintered products, a plasma spraying material, a filler and the like. The α-alumina produced by the process of the present invention comprises α-alumina single crystal particles which are not agglomerated particles and have a narrow particle size distribution, and is suitable as an abrasive, a raw material for sintered products, a plasma spraying material, a filler, a raw material for single crystals, a raw material for a carrier for catalysts, a raw material for fluorescent substances, a raw material for encapsulations, a raw material for ceramic filters, etc.

BACKGROUND ART

α-Alumina powder obtained by conventional processes comprises irregular-shaped polycrystals, contains many agglomerated particles, and has a broad particle size distribution. For some uses, the purity of conventional α-alumina powder is insufficient. In order to overcome these problems, α-alumina powder produced by special processes as hereinafter described has been employed for specific uses. However, these special processes still fail to arbitrarily control the shape or particle diameter of α-alumina. It has thus been difficult to obtain α-alumina powder having a narrow particle size distribution.

Known special processes for producing α-alumina powder include a process utilizing a hydrothermal reaction of aluminum hydroxide (hereinafter referred to as hydrothermal treatment process); a process comprising adding a flux to aluminum oxide, fusing, and precipitating (hereinafter referred to as flux process); and a process in which aluminum hydroxide is calcined in the presence of a mineralizer.

With respect to a hydrothermal treatment process, JP-B-57-22886 (the term "JP-B" as used herein means an "examined published Japanese patent application") discloses a process in which corundum is added as a seed crystal to control the particle size. The process consists of synthesis in a high temperature under a high pressure, making the resulting α-alumina powder expensive.

According to the study by Matsui, et al. (*Hydrothermal Hannou* (Hydrothermal Reactions), Vol. 2, pp. 71–78 "Growth of Alumina Single Crystal by Hydrothermal Method"), an α-alumina single crystal obtained by hydrothermal growth of an alumina single crystal containing chromium on a sapphire (α-alumina) seed crystal contains cracks. On examining the homogeneity of the crystal in an attempt to clarify the cause of the cracks, it was confirmed that a high strain exists in the boundary between the seed crystal and the grown crystal and that the density of etch pit in the grown crystal near the boundary, which seems to correspond to a dislocation density, is high. The report goes that the cracks are expected to relate to such a strain or a defect and that a hydrothermal growth process is easily accompanied by incorporation of a hydroxyl group or water into crystals, which appears to cause a strain or a defect.

A flux process has been proposed as a means for controlling the shape or particle size of α-alumina powder for use as an abrasive, a filler, etc. For example, JP-A-3-131517 (the term "JP-A" as used herein means an "unexamined published Japanese patent application") discloses a process comprising calcining aluminum hydroxide in the presence of a flux with fluorine having a melting point of not more than 800° C. to prepare α-alumina particles having an average particle diameter of from 2 to 20 μm and a hexagonal plate shape with a D/H ratio of from 5 to 40, wherein D represents a maximum particle diameter parallel to a hexagonal lattice plane of a hexagonal close-packed lattice of α-alumina, and H represents a diameter perpendicular to the hexagonal lattice plane. However, this process cannot provide fine α-alumina powder having a particle diameter of less than 2 μm, and all the particles obtained have a plate shape. It was impossible in the process to arbitrarily control the shape or size of α-alumina particles. Besides, the resulting α-alumina powder is not always suitable for use as an abrasive, a filler and a raw material for single crystals.

The Bayer process is a commonly employed and the least expensive process for producing α-alumina powder. In the Bayer process, bauxite is once converted to aluminum hydroxide or transition alumina, which is then calcined in air to prepare α-alumina powder.

The aluminum hydroxide or transition alumina which is obtained as an intermediate product on an industrial scale at low cost comprises large agglomerates having a particle diameter of greater than 10 μm. Conventional α-alumina powder obtained by calcination of such aluminum hydroxide or transition alumina in air comprises particles of irregular shape containing agglomerated coarse particles. The α-alumina powder containing agglomerated coarse particles are ground into final products by means of a ball mill, a vibration mill, etc., but grinding is not always easy and incurs the cost. α-Alumina powder having difficulty in grinding needs an extended period of time for grinding, during which fine powder may be formed or foreign materials may be incorporated only to provide α-alumina powder unsuitable as an abrasive.

Several proposals have been made to date as a solution to these problems. For example, JP-A-59-97528 discloses a process for improving the shape of α-alumina powder comprising calcining aluminum hydroxide prepared by the Bayer process in the presence of boron containing ammonium and a boron mineralizer to obtain α-alumina powder having an average particle diameter of from 1 to 10 μm and a D/H ratio approximate to 1. However, this process involves problems in that the boron-containing or fluorine-containing material added as a mineralizer remains in the resulting α-alumina and agglomerates are formed upon calcining.

In connection to calcination of sodium-containing aluminum hydroxide prepared by the Bayer process, it has been proposed to conduct calcining in the presence of a fluoride, e.g., aluminum fluoride or cryolite, and a chlorine-containing material, e.g., chlorine or hydrogen chloride in British Patent 990,801 or in the presence of boric acid, and ammonium chloride, hydrochloric acid or aluminum chloride in West German Patent 1,767,511 for the purpose of effectively removing sodium while controlling the particle diameter.

However, in the former process, since a mineralizer such as aluminum fluoride is added in a solid form or the calcination is conducted while supplying chlorine gas and fluorine gas without the addition of water, the resulting alumina particles have problems of an irregular shape and a broad particle size distribution. The latter process also involves a problem in that boric acid as a mineralizer remains in the resulting α-alumina in the form of a boron-containing material. In addition, these processes aim chiefly at removal of sodium, and the sodium salt, such as NaCl or $Na_2SO_4$, by-produced by the reaction between sodium and a sodium removing agent must be sublimed or decomposed by calcination at a high temperature of at least 1200° C.

With respect to the reaction between alumina and hydrogen chloride gas, there is a report in *Zeit. fur Anorg. und Allq. Chem.*, Vol 21, p. 209 (1932) of an equilibrium constant of the reaction system comprising sintered α-alumina having a particle diameter of from 2 to 3 mm, hydrogen chloride, and produced aluminum chloride. According to the report, while α-alumina is found produced in a place different from the place where the starting material has been charged, only hexagonal plate-shaped particles are obtained.

JP-B-43-8929 discloses a process comprising calcining alumina hydrate in the presence of ammonium chloride to produce alumina having a low impurity content and an average particle diameter of not more than 10 μm. The resulting alumina powder has a broad particle size distribution.

Therefore, none of the conventional techniques succeeded in providing α-alumina comprising α-alumina single crystal particles and satisfying requirements of purity and structural homogeneity of individual particles.

An object of the present invention is to solve the above problems and to provide a process for producing α-alumina in a powder form which comprises homogeneous and non-agglomerated α-alumina single crystal particles from various raw materials. More specifically, it is to provide a process for producing α-alumina in a powder form comprising α-alumina single crystal particles which have an octa- or higher polyhedral shape, a D/H ratio of from 0.5 to 3.0, a narrow particle size distribution, and a high alumina purity, with the individual particles being uniform in composition and freed of structural strain.

DISCLOSURE OF THE INVENTION

The present invention relates to the following inventions.

(1) a process for producing α-alumina characterized in that transition alumina and/or an alumina raw material capable of being converted to transition alumina on heating is calcined in an atmosphere containing at least 1% by volume of hydrogen chloride at a temperature of not less than 600° C.

(2) A process for producing α-alumina characterized in that transition alumina and/or an alumina raw material capable of being converted to transition alumina is calcined, while at least 1% by volume of chlorine and at least 0.1% by volume of steam are introduced to an atmosphere, at a temperature of not less than 600° C.

(3) A process for producing α-alumina as described in (1) or (2) above, wherein the calcining temperature is from 600 to 1,400° C.

(4) A process for producing α-alumina as described in (1) or (2) above, wherein the calcining temperature is from 800 to 1,200° C.

(5) A process for producing α-alumina as described in (1), (2) or (3) above, characterized in that the alumina raw material capable of converted to transition alumina on heating is aluminum hydroxide.

(6) A process for producing α-alumina as described in (1), (2) or (3), characterized in that the alumina raw material capable of being converted to transition alumina on heating is alum or aluminum sulfate.

(7) A process for producing α-alumina comprising α-alumina single crystal particles which are homogeneous and have an octa- or higher polyhedral shape and a D/H ratio of from 0.5 to 3.0, wherein D represents a maximum particle diameter parallel to a hexagonal lattice plane of a hexagonal close-packed lattice of the particles, and H represents a diameter perpendicular to the hexagonal lattice plane, characterized in that transition alumina and/or an alumina raw material capable of being converted to transition alumina on heating is calcined in an atmosphere containing at least 1% by volume of hydrogen chloride gas at a temperature of from 600 to 1,400° C.

(8) A process for producing α-alumina comprising α-alumina single crystal particles which are homogeneous and have an octa- or higher polyhedral shape and a D/H ratio of from 0.5 to 3.0, wherein D represents a maximum particle diameter parallel to a hexagonal lattice plane of a hexagonal close-packed lattice of the particles, and H represents a diameter perpendicular to the hexagonal lattice plane, characterized in that transition alumina and/or an alumina raw material capable of being converted to transition alumina on heating is calcined, while at least 1% by volume of chlorine and at least 0.1% by volume of steam are introduced to an atmosphere, at a temperature of from 600 to 1,400° C.

(9) A process for producing α-alumina comprising α-alumina single crystal particles as described in (7) or (8) above, characterized in that the resulting α-alumina single crystal particles have a deca- or higher polyhedral shape.

(10) A process for producing α-alumina as described in (7) or (8) above, wherein the α-alumina single crystal particles have an average particle diameter of from 0.1 to 30 μm and such a particle size distribution that the D90/D10 ratio is not more than 10, wherein D10 and D90 represent a cumulative 10% diameter and a cumulative 90% diameter, respectively, of a cumulative distribution depicted from the small diameter side.

(11) A process for producing α-alumina as described in (7) or (8) above, characterized in that the α-alumina has an alumina purity of not less than 99.90% by weight.

BEST MODE FOR PRACTICING THE INVENTION

Figure 1:
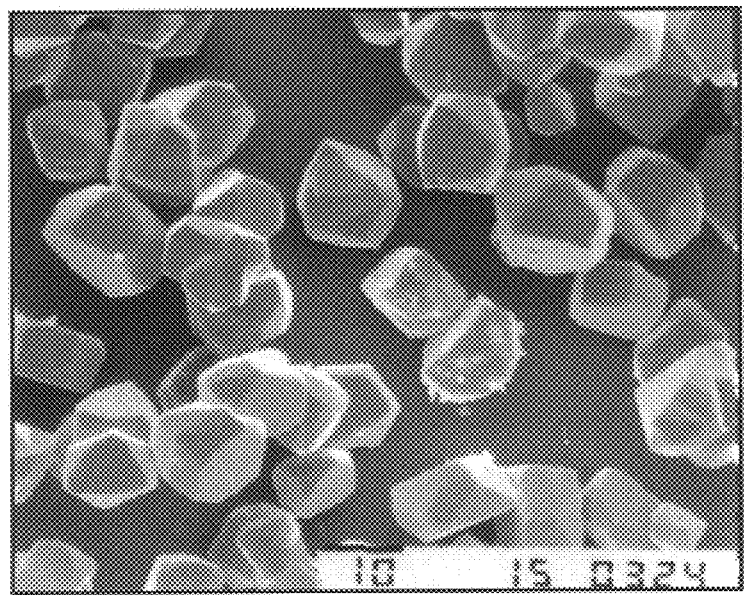
FIG. 1 is a scanning electron microscope (SEM) photograph (magnification: 930) showing the particulate shape of the α-alumina obtained in Example 1.

The present invention is described in detail below.

In the process for producing α-alumina according to the present invention, transition alumina or an alumina raw material converted to transition alumina on heating are used. Transition alumina means all alumina crystal phases included under polymorphic alumina represented by $Al_2O_3$ except α-alumina, specifically including γ-alumina, δ-alumina, θ-alumina, etc.

The term a raw material capable of being converted to transition alumina on heating include those which are once converted to transition alumina and then to α-alumina by calcination according to the present invention, such as aluminum hydroxide, aluminum sulfate, alum (e.g., potassium aluminum sulfate, ammonium aluminum sulfate), ammonium aluminum carbonate hydroxide, and alumina gel (e.g., alumina gel obtained by oxidation of aluminum by electro-discharging in water).

Synthesis methods of the transition alumina and the alumina raw material converted to transition alumina on heating are not particularly limited. Aluminum hydroxide, for example, can be obtained by the Bayer process, hydrolysis of an organoaluminum compound, or a process using, as a starting material, an aluminum compound recovered from an etching waste used for condensers, etc.

According to the process of the present invention, α-alumina in a powder form with desired characteristics can be produced from aluminum hydroxide or transition alumina whose secondary particle diameter is 10 μm or greater which is obtained by an industrial and economical process, such as the Bayer process.

Transition alumina can be obtained by a heat treatment of aluminum hydroxide, decomposition of aluminum sulfate, decomposition of alum, vapor phase decomposition of aluminum chloride, or decomposition of ammonium aluminum carbonate.

In carrying out the present invention as one embodiment, the transition alumina or the alumina raw material converted to transition alumina on heating is calcined in an atmosphere containing at least 1% by volume, preferably at least 5% by volume, and more preferably at least 10% by volume, of hydrogen chloride gas. Gases for dilution of hydrogen chloride gas include inert gases, e.g., nitrogen and argon, hydrogen and air. The pressure of the hydrogen chloride-containing atmosphere is not particularly limited and is selected arbitrarily from an industrially practical range. α-Alumina in a powder form having the excellent properties as desired can thus be obtained by calcination in a relatively low temperature as hereinafter described.

Hydrogen chloride gas may be replaced with a mixed gas of chlorine and steam. In this case, transition alumina or an alumina raw material converted to transition alumina on heating is calcined, while at least 1% by volume, preferably at least 5% by volume, and more preferably at least 10% by volume, of chlorine gas and at least 0.1% by volume, preferably at least 1% by volume, and more preferably at least 5% by volume, of steam, are introduced to an atmosphere. Gases for diluting the mixed gas of chlorine and steam include inert gases, e.g., nitrogen and argon, hydrogen and air. The pressure of the chlorine- and steam-containing atmosphere is not particularly limited and is selected arbitrarily from an industrially practical range. α-Alumina in a powder form having the excellent properties as desired can thus be obtained by calcination in a relatively low temperature as hereinafter described.

The calcining temperature is 600° C. or higher, preferably from 600 to 1,400° C., more preferably from 700 to 1,300° C., and most preferably from 800 to 1,200° C. By calcining at a temperature controlled within this range, α-alumina in a powder form comprising α-alumina single crystal particles which are hardly agglomerated and, even immediately after calcination, have a narrow particle size distribution can be obtained at an industrially advantageous rate of formation. Where the raw material comprises large particles of transition alumina or a precursor thereof, for example, agglomerated particles having an average particle diameter exceeding 10 μm, the calcining temperature is preferably set relatively high, especially at 800° C. or higher.

A proper calcining time depends on the concentration of the gas in the calcining atmosphere and the calcining temperature but is preferably 1 minute or more, and more preferably 10 minutes or more. The calcining time is sufficient if the alumina raw material undergoes crystal growth to form α-alumina. The process of the present invention makes it possible to obtain α-alumina in a shorter calcining time than required in the conventional processes.

The source and the mode of supplying of the gas of the calcining atmosphere are not particularly restricted as long as the chlorine-containing gas is introduced into the reaction system containing the starting material. For example, the component gases may be supplied from gas cylinders. Where a chlorine compound, e.g., hydrochloric acid solution, ammonium chloride, or a chlorine-containing high polymer is used as a source for the hydrogen chloride gas, it is used at its vapor pressure or as decomposed so as to give a prescribed gas composition. In some cases of using decomposition gas of ammonium chloride, etc., a solid substance deposits in a calcining furnace to cause operational troubles. Further, as the hydrogen chloride gas concentration increases, the calcination can be effected at a lower temperature in a shorter time, and the purity of the resulting α-alumina can be increased. Accordingly, it is preferable to supply hydrogen chloride or chlorine directly from a gas cylinder into a calcining furnace. The gas supply may be either in a continuous manner or in a batch system.

The calcining apparatus which can be used in the present invention is not particularly limited, and a conventional calcining furnace can be employed. The calcining furnace is preferably made of a material resistant to corrosion by hydrogen chloride gas, chlorine gas, etc. The furnace is preferably equipped with a mechanism for controlling the atmosphere. Because an acid gas, e.g., hydrogen chloride or chlorine gas, is used, the furnace is preferably air-tight. For industrial production, calcination is preferably carried out in a continuous manner by means of, for example, a tunnel kiln, a rotary kiln, a pusher kiln, etc.

Since the reaction proceeds in an acidic atmosphere, a crucible, a boat or a like tool used in the process is preferably made of alumina, quartz, acid resistant brick, or graphite.

According to the process of the present invention, α-alumina which is not agglomerated particles can be obtained. Depending on the starting material or the conditions of calcination, the resulting α-alumina may be agglomerated particles or may contain agglomerated particles. Even in such cases, the degree of agglomeration is very slight, and simple grinding will provide α-alumina which is not agglomerated.

α-Alumina single crystal particles constituting α-alumina obtained by the process of the present invention have such excellent properties that the number average particle diameter is from 0.1 to 30 μm, the D/H ratio is from 0.5 to 3.0, the particle size distribution is narrow in that the D90/D10 ratio is not more than 10, preferably not more than 9, more preferably not more than 7, wherein D10 and D90 represent a cumulative 10% diameter and a cumulative 90% diameter, respectively of a cumulative distribution depicted from the smaller diameter side, and the purity is high in that the alumina purity is 99.90% by weight or higher and the sodium content is less than 0.05% by weight in terms of $Na_2O$.

The present invention will now be illustrated in greater detail with reference to Examples, but it should be understood that the present invention is not construed as being limited thereto.

Various measurements in Examples and Comparative Examples were made as follows.

Figure 3:
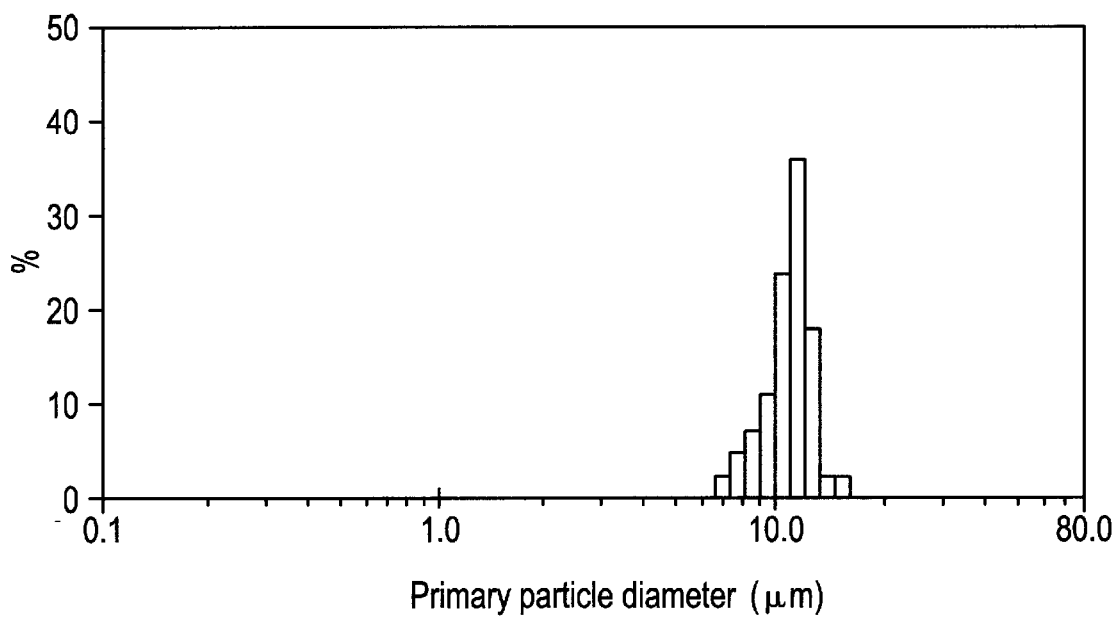
FIG. 3 is a particle size distribution of the α-alumina obtained in Example 2.

1. Particle Diameter and Particle Diameter Distribution of α-Alumina
(1) A D90/D10 ratio was measured by laser scattering method with "Master Sizer" manufactured by Malvern Instruments, Ltd.
(2) A micrograph of α-alumina powder was taken with an SEM ("T-300" manufactured by Japan Electron Optics Laboratory Co., Ltd.), and selected 80 to 100 particles of the SEM photograph were subjected to image analysis to obtain an average and a distribution of their circle-equivalent diameters. The term "circle-equivalent diameter" as used herein means a diameter of a true circle having the same area as a particle. The resulting particle diameter distribution is shown in FIG. 3.

2. Crystal Shape (D/H) of α-Alumina
The shape of α-alumina particles was represented in terms of a D/H ratio, wherein D and H are as defined above. A D/H ratio of α-alumina was obtained as an average of 5 to 10 particles by image analysis of the above-mentioned SEM photograph.

Figure 6:
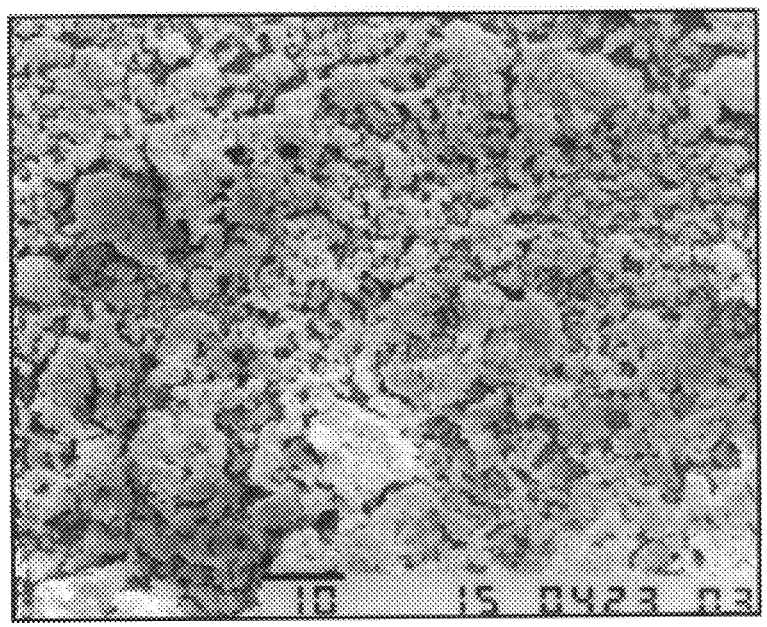
FIG. 6 is an SEM photograph (magnification: 930) showing the particulate shape of the α-alumina obtained in Comparative Example 1.

3. Number of Crystal Faces and Crystal Habit
(1) The number of crystal faces of α-alumina was obtained by observation of the above-mentioned SEM ("T-300" manufactured by Japan Electron Optics Laboratory Co., Ltd.) photograph.
(2) The crystal habit of α-alumina particles was observed for evaluating the shape. The crystal habit of the α-alumina particles obtained in the present invention (indicated by A to I) is shown in FIG. 6. α-Alumina has a hexagonal system, and the term "crystal habit" used for α-alumina means the form of its crystal characterized by the appearance of the crystal faces composed of a plane {1120}, c plane {0001}, n plane {2243}, and r plane {1012}. In FIG. 6 are shown crystal planes a, c, n, and r.

4. Alumina Purity
The amount of ions of incorporated impurities was measured by emission spectrochemical analysis to obtain the content of the impurities on oxide conversion. The chlorine content was measured by potentiometry. An alumina purity was obtained by subtracting the total impurity content (wt %) thus calculated from 100% by weight.

5. $Na_2O$ Content
The amount of a sodium ion incorporated was measured by emission spectrochemical analysis to obtain the content of $Na_2O$.

The raw materials used in Examples were as follows:
1. Transition Alumina A
Transition alumina obtained by calcination of aluminum hydroxide prepared by hydrolysis of aluminum isopropoxide ("AKP-G15" produced by Sumitomo Chemical Co., Ltd.; secondary particle diameter: about 4 μm)

2. Transition Alumina B
Transition alumina prepared by an alum method ("CR 125" produced by Baikouski Co., Ltd.; particle size: about 4 μm)

3. Transition Alumina C
Transition alumina obtained by calcining aluminum hydroxide C hereinafter described in air at 800° C. (secondary particle diameter: about 30 μm)

4. Aluminum Hydroxide A
Aluminum hydroxide powder synthesized by hydrolysis of aluminum isopropoxide (secondary particle diameter: about 8 μm)

5. Aluminum Hydroxide B
Aluminum hydroxide powder prepared by the Bayer process ("C 301" produced by Sumitomo Chemical Co., Ltd.; secondary particle diameter: about 2 μm)

6. Aluminum Hydroxide C
Aluminum hydroxide powder prepared by the Bayer process ("C 12" produced by Sumitomo Chemical Co., Ltd.; secondary particle diameter: about 47 μm)

7. Alum $(AlNH_4(SO_4).12H_2O)$
An alumina precursor capable of being converted to transition alumina by a heat treatment. A reagent produced by Wako Pure Chemical Industries, Ltd. was used.

8. Aluminum Sulfate $(Al_2(SO_4)_3.16H_2O)$
An alumina precursor capable of being converted to transition alumina by a heat treatment. A product produced by Sumitomo Chemical Co., Ltd. was used.

Hydrogen chloride in a cylinder produced by Tsurumi Soda K.K. (purity: 99.9%) and a decomposition gas of ammonium chloride were used as a hydrogen chloride gas source. In using a decomposition gas of ammonium chloride, ammonium chloride was heated at its sublimation temperature, 300° C., and the resulting hydrogen chloride gas was introduced into the reaction system to adjust the atmosphere. Ammonium chloride was completely decomposed at a calcining temperature of 1,100° C. to provide an atmosphere comprising 33% by volume of hydrogen chloride gas, 17% by volume of nitrogen gas, and 50% by volume of hydrogen gas.

Chlorine in a cylinder produced by Fujimoto Sangyo K.K. (purity: 99.4%) was used as a chlorine gas source. The volume percent of steam was controlled by adjusting the saturated vapor pressure of water dependent on temperature and introduced into a furnace with nitrogen gas.

An alumina boat was filled with 0.4 g of a raw material, such as transition alumina or aluminum hydroxide, to a depth of 5 mm. Calcination of the raw material was conducted in a tube furnace ("DSPSH-28" manufactured by Motoyama K.K.) using a quartz tube (diameter: 27 mm; length: 1000 mm). The temperature was increased at a rate of 500° C./hour while introducing nitrogen, and hydrogen chloride gas or a mixed gas of chlorine and steam was introduced into the furnace when a prescribed temperature was reached.

The gas concentration was controlled by adjustment of the gas flow rate by means of a flowmeter. The linear flow rate of the gas was set at 20 mm/min. This system was hereinafter referred to as a gas flow system. In Example 5 and Comparative Example 1 using a low hydrogen chloride gas concentration, calcination was carried out by a system in which introduction of the gas was ceased after a prescribed concentration was reached. The total pressure of the atmospheric gases was atmospheric pressure.

On reaching a prescribed temperature, the furnace was maintained at that temperature (hereinafter referred to as a calcining temperature) for a prescribed time (hereinafter referred to as a keeping time). After a lapse of a prescribed keeping time, the furnace was allowed to cool to obtain α-alumina in a powder form.

The steam partial pressure was controlled by adjusting the saturated vapor pressure, and steam was fed to the furnace with nitrogen gas.

EXAMPLES 1 TO 5

Figure 2:
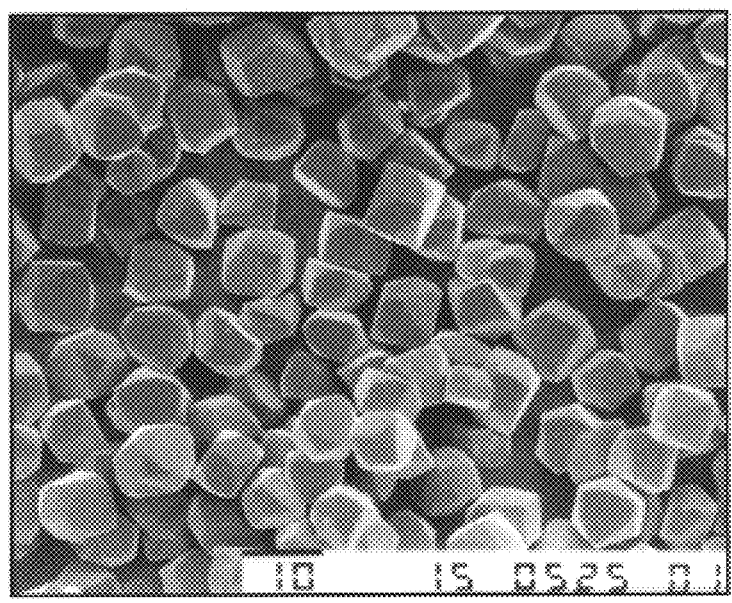
FIG. 2 is a scanning electron microscope (SEM) photograph (magnification: 930) showing the particulate shape of the α-alumina obtained in Example 2.

Transition alumina (γ-alumina) was calcined in an atmosphere having a varied hydrogen chloride gas concentration. The gas was introduced at 20° C., and the calcination was conducted at 1,100° C. for a keeping time varied according to the hydrogen chloride gas concentration. The calcination conditions and the results are shown in Tables 1 and 2 below. The SEM photographs of the α-alumina obtained in Examples 1 and 2 are shown in FIGS. 1 and 2, respectively. The particle diameter distribution of the α-alumina of Example 2 is shown in FIG. 3.

EXAMPLE 6

Calcination of transition alumina was carried out in the same manner as in Example 1, except for changing the calcining temperature and the keeping time as shown in Table 1. The results obtained are shown in Table 2.

EXAMPLES 7 AND 8

Calcination of transition alumina was carried out in the same manner as in Example 1, except for changing the temperature at which the gas was introduced and the keeping time as shown in Table 1. The results obtained are shown in Table 2.

EXAMPLES 9 TO 15

Calcination of various raw materials was carried out under the conditions shown in Table 1. In Examples 9 to 12, a decomposition gas of ammonium chloride was used as a hydrogen chloride gas source. The results obtained are shown in Table. 2.

TABLE 1

| Example No. | Alumina Raw Material Kind | Size (μm) | Composition of Atmosphere (vol %) | | | | | Gas Flow Rate (mm/min) | Temp. for Gas Introduction (° C.) | Calcining Temp. (° C.) | Keeping Time (min) |
|---|---|---|---|---|---|---|---|---|---|---|---|
| | | | HCl | Cl$_2$ | H$_2$O | N$_2$ | H$_2$ | | | | |
| 1 | transition alumina A | 4 | 100 | — | — | — | — | 20 | 20 | 1,100 | 30 |
| 2 | transition alumina A | 4 | 30 | — | — | 70 | — | 20 | 20 | 1,100 | 30 |
| 3 | transition alumina A | 4 | 20 | — | — | 80 | — | 20 | 20 | 1,100 | 120 |
| 4 | transition alumina A | 4 | 5 | — | — | 95 | — | 20 | 20 | 1,100 | 180 |
| 5 | transition alumina A | 4 | 1 | — | — | 99 | — | 0 | 20 | 1,100 | 600 |
| 6 | transition alumina A | 4 | 100 | — | — | — | — | 20 | 20 | 800 | 120 |
| 7 | transition alumina A | 4 | 100 | — | — | — | — | 20 | 1,100 | 1,100 | 40 |
| 8 | transition alumina A | 4 | 100 | — | — | — | — | 20 | 1,100 | 1,100 | 10 |
| 9 | transition alumina A | 4 | 33 | — | — | 17 | 50 | 20 | 800 | 1,100 | 30 |
| 10 | aluminum hydroxide A | 8 | 33 | — | — | 17 | 50 | 20 | 800 | 1,100 | 30 |
| 11 | transition alumina B | 4 | 33 | — | — | 17 | 50 | 20 | 800 | 1,100 | 30 |
| 12 | aluminum hydroxide B | 2 | 33 | — | — | 17 | 50 | 20 | 800 | 1,100 | 30 |
| 13 | aluminum hydroxide C | 47 | 30 | — | — | 70 | — | 20 | 20 | 1,100 | 30 |
| 14 | alum | — | 30 | — | — | 70 | — | 20 | 20 | 1,100 | 30 |
| 15 | aluminum sulfate | — | 30 | — | — | 70 | — | 20 | 20 | 1,100 | 30 |

TABLE 2

| Example No. | Number Average Particle Diameter (μm) | Crystal Shape D/H | Crystal Habit | Number of Crystal Planes | Size Distribution D90/D10 | Alumina Purity (wt %) | Na$_2$O Content (ppm) | Remark |
|---|---|---|---|---|---|---|---|---|
| 1 | 11 | 1–2 | F, H | 8 | 4 | 99.96 | 5 | — |
| 2 | 11.6 | 1 | G | 12–18 | 3 | — | — | — |
| 3 | 11 | 0.5–1 | — | 20 or more | 3 | — | — | — |
| 4 | 11 | about 1 | — | 20 or more | 3 | — | — | — |
| 5 | 11 | about 1 | — | 20 or more | 3 | — | — | — |
| 6 | 11 | 1 | G | 20 or more | 3 | — | — | — |
| 7 | 11 | 1 | — | 20 or more | 3 | — | — | — |

TABLE 2-continued

| Example No. | Number Average Particle Diameter (μm) | Crystal Shape D/H | Crystal Habit | Number of Crystal Planes | Size Distribution D90/D10 | Alumina Purity (wt %) | Na₂O Content (ppm) | Remark |
|---|---|---|---|---|---|---|---|---|
| 8 | 11 | 1 | — | 20 or more | 3 | — | — | — |
| 9 | 11 | 1 | — | 20 or more | 4 | — | — | — |
| 10 | 14 | 1 | F, H | 20 or more | 3 | >99.95 | 5 | — |
| 11 | 9 | 1 | G, H | 20 or more | 3 | — | — | — |
| 12 | 2 | 1–2 | — | 14 or more | 9 | >99.95 | 54 | — |
| 13 | 4 | 2 | — | 20 or more | 9 | — | — | — |
| 14 | 2 | about 1 | F, H | 20 or more | 9 | — | — | — |
| 15 | 6 | 1 | F, H | 20 or more | 9 | — | — | — |

EXAMPLES 16 TO 18

Figure 4:
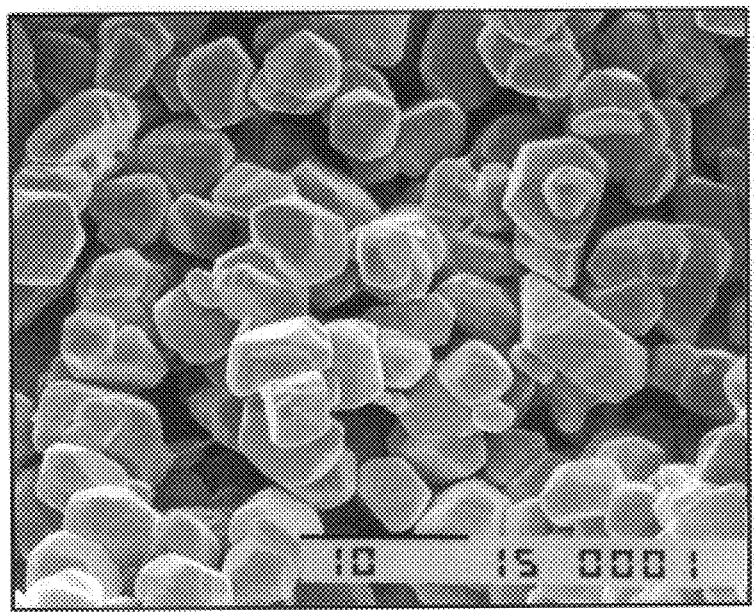
FIG. 4 is an SEM photograph (magnification: 1,900) showing the particulate shape of the α-alumina obtained in Comparative Example 16.

Aluminum hydroxide having a large particle size obtained by the Bayer process (aluminum hydroxide C) was calcined under the conditions shown in Table 3. The results obtained are shown in Table 4. The SEM photograph of the α-alumina obtained in Example 16 is shown in FIG. 4.

EXAMPLE 19

Transition alumina C obtained by calcination of aluminum hydroxide powder having a large particle size obtained by the Bayer process (aluminum hydroxide C) was calcined under the conditions shown in Table 3. The results obtained are shown in Table 4.

EXAMPLES 20 AND 21

Figure 5:
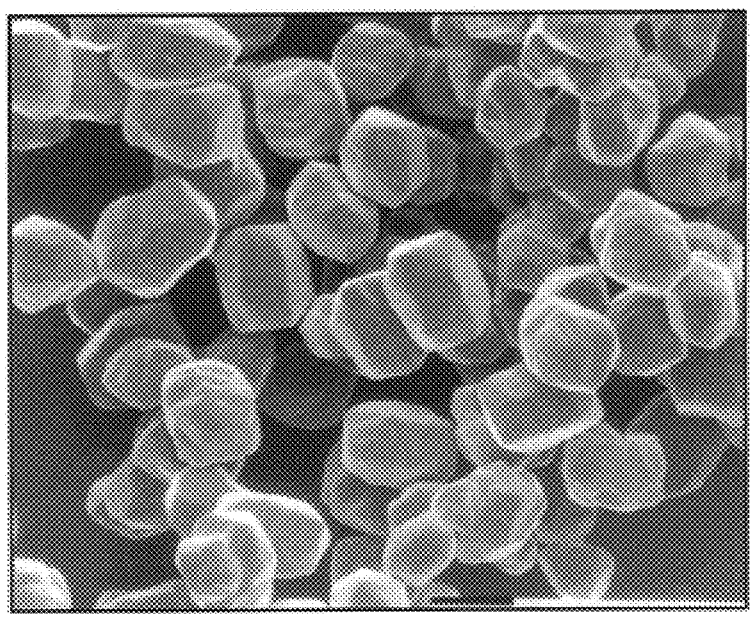
FIG. 5 is an SEM photograph (magnification: 930) showing the particulate shape of the α-alumina obtained in Example 20.

Transition alumina or aluminum hydroxide was calcined in an atmosphere containing chlorine gas and steam under the conditions shown in Table 3. The results obtained are shown in Table 4. The SEM photograph of the α-alumina obtained in Example 20 is shown in FIG. 5.

Comparative Examples 1 to 5

Figure 7:
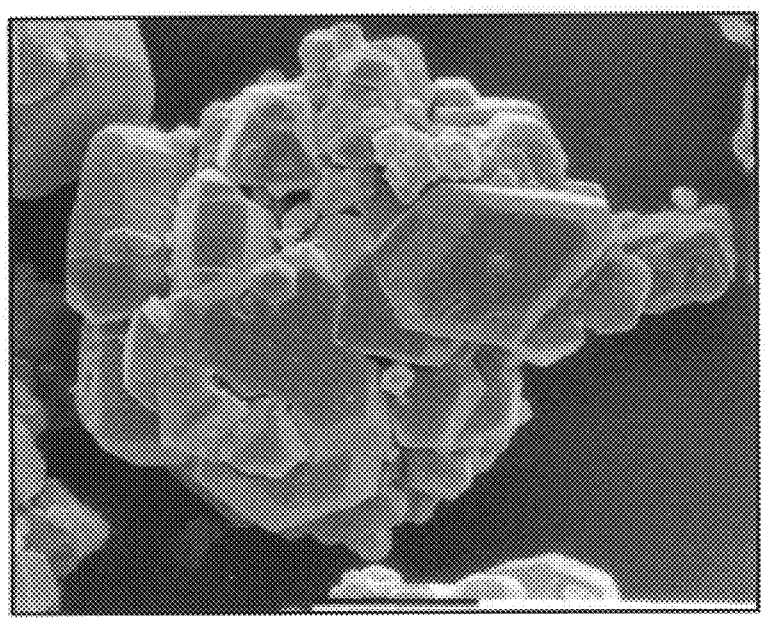
FIG. 7 is an SEM photograph (magnification: 1,900) showing the particulate shape of the α-alumina obtained in Comparative Example 5.
Figure 8A:
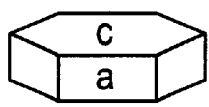
FIG. 8 shows the crystal habit of an α-alumina single crystal.
Figure 8D:
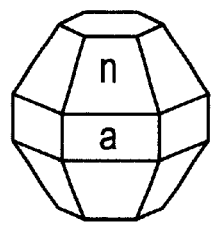
Figure 8G:
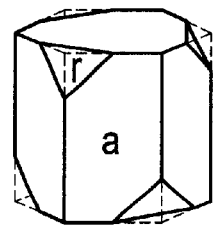
Figure 8B:
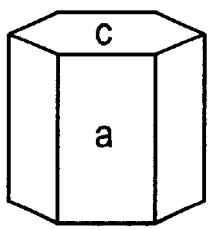
Figure 8E:
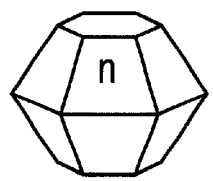
Figure 8H:
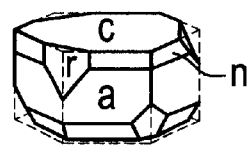
Figure 8C:
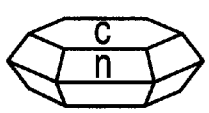
Figure 8F:
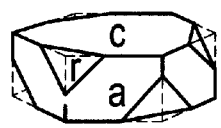
Figure 8I:
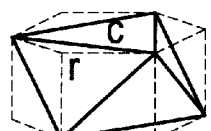

Calcination of transition alumina or aluminum hydroxide was carried out under conditions shown in Table 3 which were outside the scope of the present invention. The results obtained are shown in Table 4, and the SEM photographs of the α-alumina obtained in Comparative Examples 1 and 5 are shown in FIGS. 6 and 7, respectively.

TABLE 3

| | Alumina Raw Material | | Composition of Atmosphere (vol %) | | | | | Gas Flow Rate | Temp. for Gas Introduction | Calcining Temp. | Keeping Time |
|---|---|---|---|---|---|---|---|---|---|---|---|
| | Kind | Size (μm) | HCl | Cl₂ | H₂O | N₂ | H₂ | (mm/min) | (° C.) | (° C.) | (min) |
| Example 16 | aluminum hydroxide C | 47 | 100 | — | — | — | — | 35 | 20 | 1,100 | 180 |
| Example 17 | aluminum hydroxide C | 47 | 30 | — | — | 70 | — | 35 | 500 | 1,100 | 30 |
| Example 18 | aluminum hydroxide C | 47 | 100 | — | — | — | — | 35 | 20 | 900 | 30 |
| Example 19 | transition alumina C | 30 | 100 | — | — | — | — | 35 | 700 | 1,100 | 30 |
| Example 20 | transition alumina A | 4 | — | 35 | 5 | 60 | — | 20 | 20 | 1,100 | 30 |
| Example 21 | aluminum hydroxide C | 47 | — | 35 | 5 | 60 | — | 49 | 20 | 1,100 | 30 |
| Comparative Example 1 | transition alumina A | 4 | 0.5 | — | — | 99.5 | — | 0 | 20 | 1,100 | 600 |
| Comparative Example 2 | transition alumina A | 4 | 100 | — | — | — | — | 20 | 20 | 500 | 600 |
| Comparative Example 3 | transition alumina A | 4 | — | 30 | — | 70 | — | 20 | 20 | 1,100 | 30 |
| Comparative Example 4 | aluminum hydroxide C | 47 | calcination in air | | | | | — | — | 1,300 | 180 |
| Comparative Example 5 | aluminum hydroxide C | 47 | calcination in air | | | | | — | — | 1,100 | 180 |

TABLE 4

| | Number Average Particle Diameter (μm) | Crystal Shape D/H | Crystal Habit | Number of Crystal Planes | Size Distribution D90/D10 | Alumina Purity (wt %) | Na$_2$O Content (ppm) | Remark |
|---|---|---|---|---|---|---|---|---|
| Example 16 | 4 | 1–2 | F, H | 8 or more | 7 | >99.95 | — | — |
| Example 17 | 4 | 1–2 | C | 14 or more | — | — | — | — |
| Example 18 | 4 | 1–2 | C, I | 8 or more | — | — | — | — |
| Example 19 | 4 | 1–2 | C, A | 14 or more | — | — | — | — |
| Example 20 | 11 | 1 | G | 20 or more | 3 | — | — | — |
| Example 21 | 5 | 1–2 | C, A | 8 or more | — | — | — | — |
| Comparative Example 1 | — | | (no single crystal was formed) | | | — | — | γ—, η—, and α-crystals |
| Comparative Example 2 | — | | (no single crystal was formed) | | | — | — | γ— and η— crystals |
| Comparative Example 3 | — | | (no single crystal was formed) | | | — | — | γ—, η—, and α-crystals |
| Comparative Example 4 | 0.3 | | (no single crystal was formed) | | | — | — | α-crystals |
| Comparative Example 5 | — | | (no single crystal was formed) | | | — | — | κ— and θ— crystals |

Industrial Utility

According to the process for producing α-alumina of the present invention, α-alumina comprising octahedral or higher polyhedral α-alumina single crystal particles which have a high alumina purity, are fine and homogeneous, have a narrow particle size distribution, and are not agglomerated particles can be obtained from raw materials of various kinds, purities, shapes, sizes, and compositions.

More specifically, the α-alumina particles produced by the process of the present invention have excellent characteristics such as an average particle diameter of from 0.1 to 30 μm, a D/H ratio of from 0.5 to 3.0, a D90/D10 ratio of not more than 10, preferably not more than 9, and more preferably not more than 7, an alumina purity of 99.90% by weight or higher, and a sodium content of less than 0.05% by weight in terms of Na$_2$O.

The α-alumina comprising α-alumina single crystal particles having the above-described excellent characteristics is suitable as an abrasive, a raw material for sintered products, a plasma flame spraying material, a filler, a raw material for single crystals, a raw material for a carrier of catalysts, a raw material for fluorescent substances, a raw material for encapsulations, a raw material for ceramic filters, etc. and is extremely useful in industry. Owing to the extremely high purity, the α-alumina obtained by the present invention is particularly useful as a raw material for single crystals (e.g., yttrium aluminum garnet (YAG), sapphire, ruby, etc.) and high purity sintered products to which α-alumina of low purity cannot be applied. The fine α-alumina obtained by the process of the present invention is particularly suitable as a precision abrasive or a raw material for ceramic filters.

What is claimed is:

1. A process for producing α-alumina by calcining a transition alumina obtained by calcination of aluminum hydroxide prepared by hydrolysis of aluminum isopropoxide in an atmosphere containing at least 10% of volume of hydrogen chloride, at a temperature of from 700 to 1,300° C., at atmosphere pressure and for a calcining time of from 10–120 minutes to produce said α-alumina.

2. A process for producing α-alumina as in claim 1, wherein the calcining temperature is from 800 to 1,200° C.

3. A process for producing α-alumina as in claim 1, wherein said calcining temperature is from 800 to 1,100° C.

4. A process for producing α-alumina comprising α-alumina single crystal particles which are homogeneous and have an octa- or higher polyhedral shape and a D/H ratio of from 0.5 to 3.0, wherein D represents a maximum particle diameter parallel to a hexagonal lattice plane of a hexagonal close-packed lattice of said particles, and H represents a diameter perpendicular to the hexagonal lattice plane, comprising the step of calcining transition alumina obtained by calcination of aluminum hydroxide prepared by hydrolysis of aluminum isopropoxide in an atmosphere containing at least 10% of volume of hydrogen chloride, at a temperature of from 700 to 1,300° C., at atmosphere pressure and for a calcining time of from 10–120 minutes to produce said α-alumina.

5. A process for producing α-alumina comprising α-alumina single crystal particles as in claim 4, wherein said α-alumina single crystal particles have a deca- or higher polyhedral shape.

6. A process for producing α-alumina as in claim 4, wherein said α-alumina single crystal particles have an average particle diameter of from 0.1 to 30 μm and such a particle size distribution that the D90/D10 ratio is not more than 10, wherein D10 and D90 represent a cumulative 10% diameter and a cumulative 90% diameter, respectively, of a cumulative distribution depicted from the small diameter side.

7. A process for producing α-alumina as in claim 4, wherein said α-alumina has an alumina purity of not less than 99.90% by weight.

* * * * *